United States Patent
Lawlyes et al.

(10) Patent No.: US 7,510,108 B2
(45) Date of Patent: Mar. 31, 2009

(54) METHOD OF MAKING AN ELECTRONIC ASSEMBLY

(75) Inventors: Daniel A. Lawlyes, Kokomo, IN (US); David A. Laudick, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 525 days.

(21) Appl. No.: 11/190,130

(22) Filed: Jul. 26, 2005

(65) Prior Publication Data

US 2007/0023488 A1    Feb. 1, 2007

(51) Int. Cl.
*H01L 23/48* (2006.01)
*B23K 31/02* (2006.01)

(52) U.S. Cl. ............... 228/179.1; 228/222; 257/704; 257/706; 257/778; 361/783; 361/760; 438/106; 438/108

(58) Field of Classification Search ............ 228/180.22, 228/179.1, 222; 257/704, 706, 778; 361/783, 361/760; 438/106, 108
See application file for complete search history.

(56) References Cited

U.S. PATENT DOCUMENTS

| | | | | |
|---|---|---|---|---|
| 6,038,136 A | * | 3/2000 | Weber | 361/783 |
| 6,212,073 B1 | * | 4/2001 | Yamaguchi | 361/705 |
| 6,617,510 B2 | | 9/2003 | Schreiber et al. | |
| 6,821,816 B1 | | 11/2004 | Lawlyes | |
| 6,869,291 B2 | | 3/2005 | Norland et al. | |
| 2002/0110956 A1 | * | 8/2002 | Kumamoto et al. | 438/108 |
| 2003/0067070 A1 | * | 4/2003 | Kwon et al. | 257/706 |

* cited by examiner

*Primary Examiner*—Kiley Stoner
*Assistant Examiner*—Erin B Saad
(74) *Attorney, Agent, or Firm*—Jimmy L. Funke

(57) ABSTRACT

A method of making an electronic assembly comprising an electronic component that is attached to a circuit board by protruding solder bumps of the electronic component places the electronic component on a surface of the circuit board so that solder bumps on the bottom of the electronic component engage contact pads on the top of the circuit board. The solder bumps are then reflowed to attach the electronic component to the circuit board after which the electronic component is underfilled by providing a mold die having a mold cavity, a gate leading into the mold cavity and a vent leading out of the mold cavity. The mold die is placed over the electronic component and onto the surface of the circuit board so that the electronic component is inside the mold cavity and the mold cavity is sealed. An encapsulating material, preferably an epoxy material, is transferred or injected into the mold cavity to fill space between the respective surfaces of the electronic component and the circuit board and then cured to encapsulate the solder bumps that have been reflowed. An optional integrated heat sink for the electronic component may be used when practicing the method of the invention to make an electronic assembly.

3 Claims, 4 Drawing Sheets

METHOD OF MAKING AN ELECTRONIC ASSEMBLY

FIELD OF THE INVENTION

This invention relates to a method of making an electronic assembly.

BACKGROUND OF THE INVENTION

A typical electronic assembly is circuit board that has electronic components, such as PBGAs and flip chips, attached to it. Each of these electronic components has solder bumps on the bottom that are reflowed to attach the electronic component to contact pads on the circuit board.

Consequently, it is conventional practice to underfill the electronic component with a polymeric material after it is attached to the circuit board. The electronic component is vulnerable to damage due to handling and electrical testing. The bottom of the electronic component must be cleaned of flux residue in order for epoxy underfill to be used.

In the present underfill process a liquid polymeric material is dispensed through a needle to two sides of the attached electronic component and then the needle progresses to another attached electronic component to repeat the same process. Meanwhile the underfill material wicks beneath the electronic component and around the solder bumps. After the material wicks inwardly the desired distance, the liquid polymeric material is dispensed to the remaining two sides of the attached electronic component, finishing the underfill coverage.

After the liquid of underfill material is dispensed, the underfill material is cured at an elevated temperature for a given period of time, for example, approximately 1 hour at 150 degrees Centigrade.

After cure, the electronic assembly can be handled with less concern and the electronic component itself and solder bumps are also less vulnerable to damage. The electronic component is normally thermally engaged to a heat sink by contacting thermal grease or the like applied to the top of the electronic component to dissipate heat resulting from operation of the electronic assembly.

This process has an appreciable yield loss due to underfill accidentally curing on the top of the electronic device which interferes with heat transfer when a heat sink is used.

SUMMARY OF THE INVENTION

This invention provides a method of making an electronic assembly having an electric component that is underfilled in a unique manner to reduce yield loss. The underfill method improves long-term reliability of the solder joint between the electronic component and the circuit board of the electronic assembly. The underfill method preferably uses an epoxy material that compliments the solder bumps and retains their strength for years.

In making an electronic assembly comprising an electronic component that is attached to a circuit board by protruding solder bumps of the electronic component, the method of the invention places the electronic component on a surface of the circuit board so that solder bumps on the bottom of the electronic component engage contact pads on the top of the circuit board. The solder bumps are then reflowed to attach the electronic component to the circuit board after which the electronic component is underfilled by providing a mold die having a mold cavity, a gate leading into the mold cavity and a vent leading out of the mold cavity. The mold die is placed over the electronic component and onto the surface of the circuit board so that the electronic component is inside the mold cavity and the mold cavity is sealed. Thermoset pellets, preferably of an epoxy material, are inserted into a transfer press and transferred or injected into the mold cavity to fill space between the respective surfaces of the electronic component and the circuit board and then cured to encapsulate the solder bumps that have been reflowed. An optional integrated heat sink for the electronic component may also be included when practicing the method of the invention to make an electronic assembly.

DETAILED DESCRIPTION OF PREFERRED EMBODIMENTS

Figure 1:
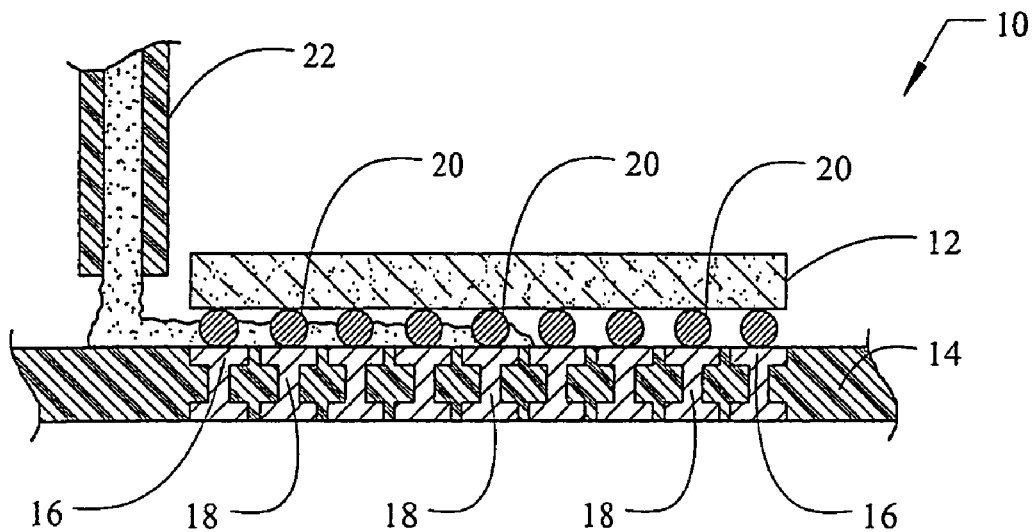
FIG. 1 is a sectional view of an electronic assembly being manufactured according to a prior art method.
Figure 2:
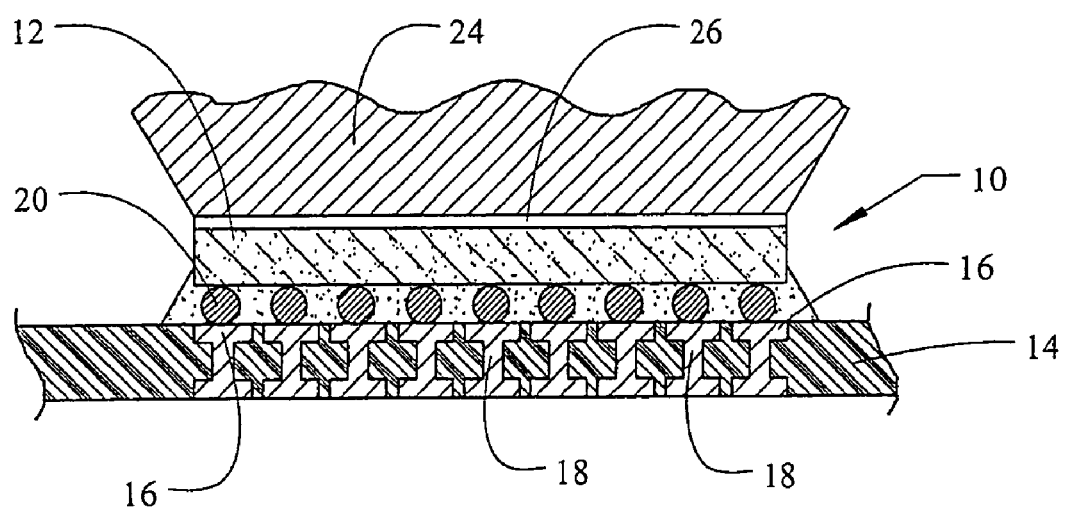
FIG. 2 is section view of the electronic assembly of FIG. 1 after being manufactured according to the prior art method.

FIGS. 1 and 2 illustrate a prior art method of making an electronic assembly 10 comprising an electronic component 12, such as a flip chip, and a circuit board 14. The prior art and the invention methods are described in connection with one electronic component being attached to a circuit board. However, circuit boards typically have several electronic components of various sizes and complexities attached to them, some or all of which may be attached to the circuit board utilizing the method of the invention.

The typical circuit board 14 is basically a substrate of insulation material that carries traces of electrically conductive material such as copper, forming electrical circuits that include contact pads for making electrical connections. Electrical and electronic components are attached to the circuit board and connected electrically to the electrical circuits using contact pads on the top surface of the circuit board. In many instances the circuit board is a laminate comprising several insulation layers with circuit traces on various insulation layers. Electrical connections with traces for electrical circuits below the top surface are made by vias of electrically conductive material extending downwardly from the contact pads through one or more insulation layers forming the laminated circuit board.

The circuit board 14 is a schematic cross section of a laminated circuit board having contact pads 16 on its top surface that are connected to circuit traces (not shown) at various levels beneath the top surface by solder vias 18.

Flip chip 12 has a plurality of solder bumps 20 that project from the bottom surface. Solder bumps 20 are actually tiny balls or spheres of solder that are soldered to electrical contact pads (not shown) on the bottom of flip chip 12. The bottom of a flip chip is typically square or rectangular with one or two rows of solder bumps 20 extending along each side near the edge. After the solder bumps 20 are soldered to contact pads on the bottom of flip chip 12, the flip chip 12 is typically cleaned to remove flux residue in accordance with conventional methods.

Flip chip 12 is then placed on circuit board 14 with solder bumps 20 engaging contact pads 16 as shown in FIG. 1. Flip chip 12 is then underfilled with a liquid polymeric encapsulating material that is dispensed with a needle 22. Needle 22 dispenses the material at one end of a row of solder bumps 20 and the material progresses inwardly under a wicking action. The row or rows on each of the four sides is underfilled in this manner until the flip chip 12 is completely underfilled and cured forming the electronic assembly 10 that is shown in FIG. 2.

In use, an electronic assembly, such as electronic assembly 10 is usually associated with a heat sink. For instance, see U.S. Pat. No. 6,821,816 B1 granted to Daniel A. Lawlyes, Nov. 23, 2004. Consequently, electronic assembly 10 may be used with a heat sink, such as heat sink pedestal 26 that engages the upper surface of flip chip 12. A layer of thermal grease 32 is usually applied to the top surface of flip chip 12 to improve heat transfer.

Figure 3:
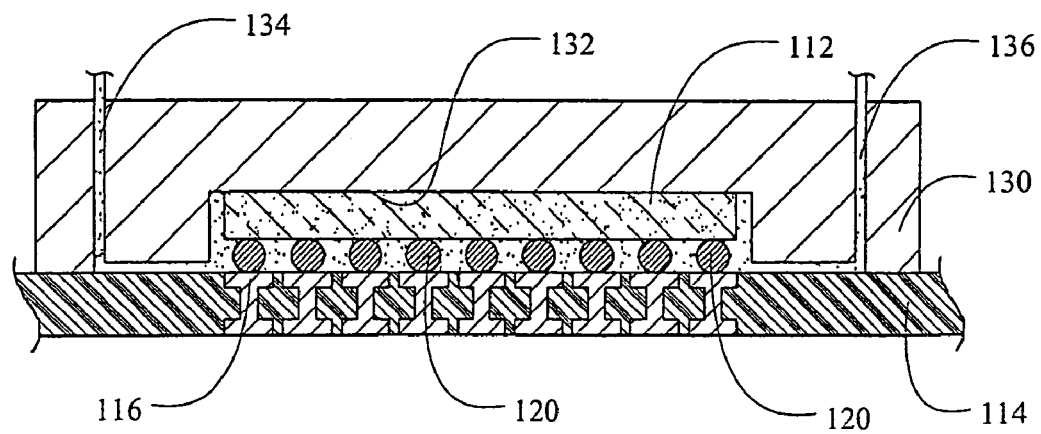
FIG. 3 is a sectional view of an electronic assembly being manufactured according to the method of the invention.
Figure 4:
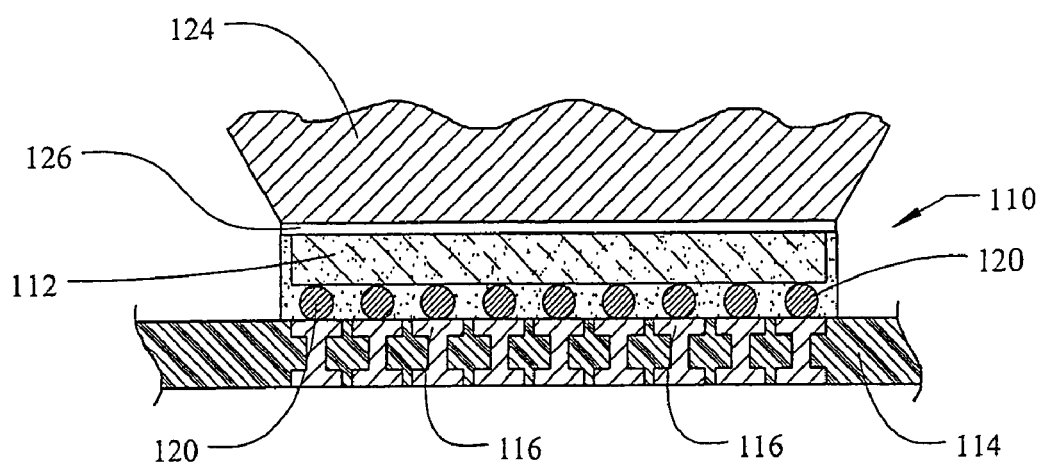
FIG. 4 is a sectional view of the electronic assembly of FIG. 3 after being manufactured according to the method of the invention.

FIGS. 3 and 4 illustrate an electronic assembly 110 comprising an electronic component 112, such as a flip chip, and a circuit board 114 that is manufactured according to the method of the invention. In the method of the invention, flip chip 112 is attached to circuit board 114 by protruding solder bumps 120 of the flip chip 112 which have already been soldered to contact pads on the bottom of the flip chip in accordance with standard practice as described above. Flip chip 112 is then placed on the surface of circuit board 114 so that solder bumps 120 engage contact pads 116 on the upper surface of circuit board 114 so that solder bumps 120 are in electrical contact with traces of the circuit board 114 forming various electrical circuits. Solder bumps 120 are then reflowed to attach flip chip 112 to circuit board 114 electrically and mechanically in a conventional manner.

Flip chip 112 is then underfilled. In order to underfill flip chip 112, a precision mold die 130 having a mold cavity 132, a gate 134 leading into the mold cavity and a vent 136 leading out of the mold cavity, is provided. Mold die 130 is then placed over flip chip 112 and onto the upper surface of circuit board 114 so that the electronic component is inside mold cavity 132. The mold cavity 132 is sealed, preferably by holding or clamping mold die 130 against the upper surface of circuit board 114. The mold die 130 is preferably precisely dimensioned so that the inner upper surface of mold cavity 132 seals against the top surface of flip chip 112.

A polymeric encapsulating material, such as thermoset pellets, preferably of an epoxy material are inserted into a transfer press (not shown) and then transferred or injected into mold cavity 132 through gate 134 to fill space between the respective confronting surfaces of the flip chip 112 and the circuit board 114 encapsulating the solder bumps 120 that have been reflowed as shown in FIG. 3. The encapsulating material is elevated in temperature, for instance to a temperature of approximately 165 degrees centigrade, and forced under pressure to flow through gate 134 and into the space between the bottom surface of flip chip 112 and the top surface of circuit board 114. The flow of encapsulating material removes all voids due to the packing pressure and vacuum assist for a given period of time for instance, a packing pressure of 160 pounds per square inch (psi) for 120 seconds. The epoxy material preferably has a CTE (coefficient of thermal expansion) matched to the surrounding flip chip 112 and circuit board 114.

Following the cure of encapsulating material, the mold die 130 and the gate and vent runners are removed to expose the finished electronic assembly 110 as shown in FIG. 4. Gate 134 and vent 136 are preferably designed to produce break points at the inner ends of the runners so that the runners are removed easily. Electronic assembly 110 can now proceed to final assembly packaging with less concern than typical precautions needed when transporting the electronic assembly 110 prior to underfill.

FIG. 4 illustrates the finished electronic assembly 110 and the relationship of the electronic assembly 10 to a heat sink 124 and an intervening layer of thermal grease 126. The epoxy encapsulating material that is injected into mold cavity 132 between the flip chip 112 and the circuit board 114 and then cured preferably surrounds the entire flip chip 112 except for the top of flip chip 112 as shown in FIG. 4. The top of the flip chip 112 is preferably in sealing contact with the mold die 130 during the underfilling process. Thus epoxy material does not flow into any space between the top of flip chip 112 and mold 130. This feature improves yield of electronic assemblies which require heat transfer to a heat sink.

The epoxy material provides the same protection as the prior art underfill materials while avoiding the considerable cure time and dispense time required by the prior art method. Moreover, since most flip chips dissipate heat through the top of the flip chip, the method of the invention improves yield in comparison to prior art methods.

In the prior art electronic assembly 10 described above, there is no heat sink present until the electronic assembly 10 is placed into a housing such as that disclosed in the Lawlyes '816 patent cited above.

In another aspect of this invention, the electronic assembly is made with an integral heat sink.

Figure 5:
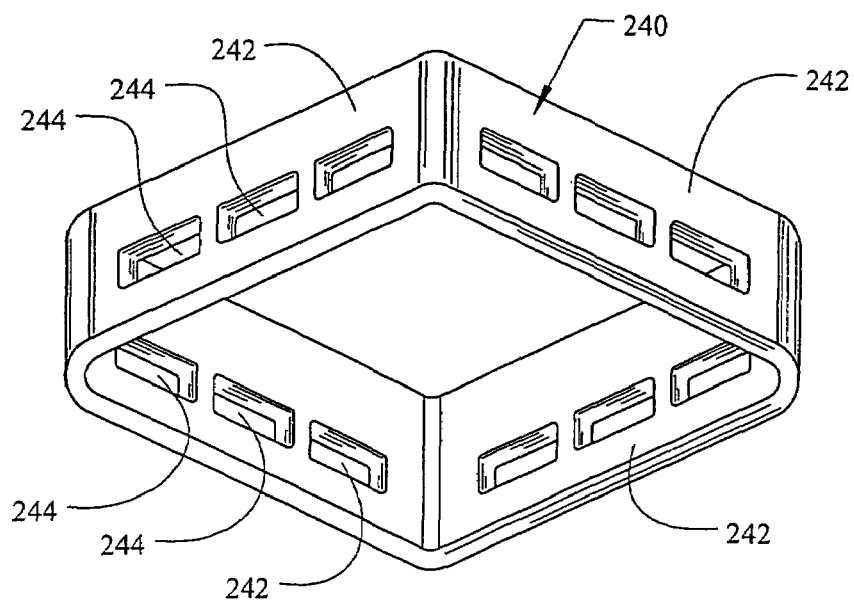
FIG. 5 is a perspective view of a component used in another electronic assembly that is manufactured according to the method of the invention.
Figure 6:
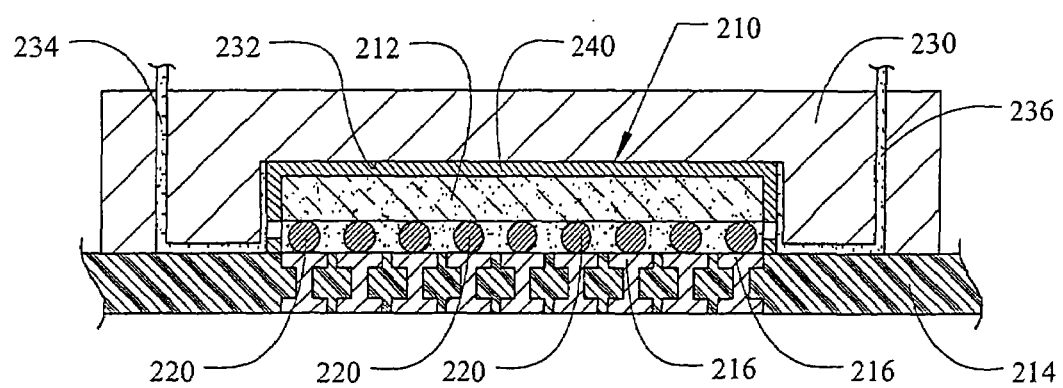
FIG. 6 is a sectional view of the component of FIG. 5 in the electronic assembly being manufactured according to the method of the invention.

Referring now to FIGS. 5 and 6, FIG. 5 is a perspective view of a heat sink 240 that is used in another electronic assembly 210 that is manufactured according to the method of the invention. FIG. 6 is a sectional view of the electronic assembly 210 having the heat sink 240, in the process of being manufactured according to the method of the invention.

In the manufacture of electronic assembly 210, flip chip 212 is attached to circuit board 214 by protruding solder bumps 220 of the flip chip 212 which have already been soldered to contact pads on the bottom of the flip chip in accordance with standard practice. Flip chip 212 is then placed on the surface of circuit board 214 so that solder bumps 220 engage contact pads 216 on the upper surface of circuit board 214. Solder bumps 220 are then reflowed to attach flip chip 212 to circuit board 214 electrically and mechanically in a conventional manner.

Heat sink 240 is then placed over flip chip 214 before underfilling flip chip 214, the heat sink 240 being inside the mold cavity 232 when the mold die 230 is placed over the flip chip. Heat sink 240 is a hollow hexahedronal or cube shaped shell having four side walls 242 defining an open bottom. Each side wall 242 has a plurality of flow through windows 244 near the open bottom. Side walls 242 are sized so that the top wall of heat sink 240 engages the top of flip chip 212 when heat sink 240 is placed over the flip chip.

Flip chip 212 is then underfilled. In order to underfill flip chip 212, a precision mold die 230 having a mold cavity 232, a gate 234 leading into the mold cavity and a vent 236 leading out of the mold cavity, is provided. Mold die 230 is then placed over the heat sink 240 which has been placed over the flip chip 212 and onto the upper surface of circuit board 214 so that the heat sink 240 and flip chip 212 are both inside mold cavity 232. The mold cavity 232 is sealed, preferably by holding or clamping mold die 230 against the surface of the circuit board 214. Moreover, the mold die 230 and the heat sink 240 are preferably dimensioned so that the top of the mold die 230 seals against the top of the heat sink 240, and the top of the heat sink 240 in turn seals against the top of the flip chip 212.

Encapsulating material, such as thermoset pellets, preferably of an epoxy material are inserted into a transfer press and transferred or injected into mold cavity 232 to fill the space between the respective confronting surfaces of the flip chip 212 and the circuit board 214 and encapsulate the solder bumps 220 that have been reflowed as shown in FIG. 6. The thermoset pellets are elevated in temperature and forced under pressure to flow through gate 134 and into the space between the bottom of flip chip 212 and the circuit board 214, for example elevated to a temperature of approximately 165 degrees centigrade and forced under a pressure of 160 pounds per square inch (psi). During the flow of material all voids are removed, due to the packing pressure event for a given period of time, for example 120 seconds. The epoxy material is preferably CTE (coefficient of thermal expansion) matched to the surrounding devices and components.

Following the cure of encapsulating material, the mold die 230 and the gate and vent runners are removed to expose the finished electronic assembly 210. Gate 234 and vent 236 are preferably designed to produce break points at the inner ends of the runners so that the runners are removed easily. The circuit assembly 210 can now proceed to final assembly packaging with less concern than typical precautions needed when transporting the electronic assembly 210 prior to underfill.

FIG. 6 illustrates the electronic assembly 210 and the relationship of the electronic assembly 210 to the integral heat sink 240. The epoxy material injected into the mold cavity 232 and cured preferably surrounds the heat sink 240 except for the top of the heat sink 240. Preferably, the top of the heat sink 240 is in sealing contact with the mold cavity 232, and the top of the heat sink 240 is in sealing contact with the top of flip chip 212 during the molding process so that epoxy material does not flow onto the top of the heat sink 240 or onto the top of flip chip 212. This feature reduces yield loss associated with prior art underfill methods.

The epoxy underfill provides the same protection as the underfill materials of the prior art while avoiding the considerable cure time and dispense time requirements of the prior art method. Moreover, the integral heat sink 240 provides increased heat dissipation capability via the thermal conductivity of the specific material of the integral heat sink 240 and the intimate contact with the top of flip chip 212. Heat sink 240 is preferably a non-ferrous metal. The flip chip encapsulation with an integral heat sink has protection from housing heat sink damage and can be fully tested with simulated loads in a manufacturing test fixture. The electronic assembly 210 can be used in conjunction with a second heat sink, such as the heat sink 124 shown in FIG. 4 if necessary. However, if heat dissipation is less than that generated by 0.25 watts of power, contact to a second heat sink should not be necessary.

Prior to mold closure and placement of the flip chip 212, the integral heat sink 240 can be loaded into mold 230. The heat sink 240 is preferably precision located in mold 230 to avoid damage to flip chip 212 or surrounding components on circuit board 214. The flow through windows 244 allow material to completely surround the flip chip 212, solder bumps 220 and the heat sink 240 itself, thus permanently locking the integral heat sink 240 into the electronic assembly 210.

The method of the invention may also be applied to larger electronic components, for instance packaged integrated circuits such as those referred to as a PBGA or Plastic Ball Grid Array or referred to as a CSP or a Chip Scale Package. Each of these types of electronic components has large solder balls on the bottom that are reflowed to attach the larger electronic component to contact pads for circuit traces of the circuit board.

Due to the physical size of some PBGA components, it may not be economical to dispense and cure an epoxy underfill material when practicing the method of the invention. CSP components, on the other hand, are typically smaller in size, so an epoxy underfill can often be used economically when practicing the method of the invention. With these larger electronic components, X-ray inspection can be used to inspect the solder joint integrity after reflow and/or to inspect the epoxy flow characteristic around the solder balls.

Figure 7:
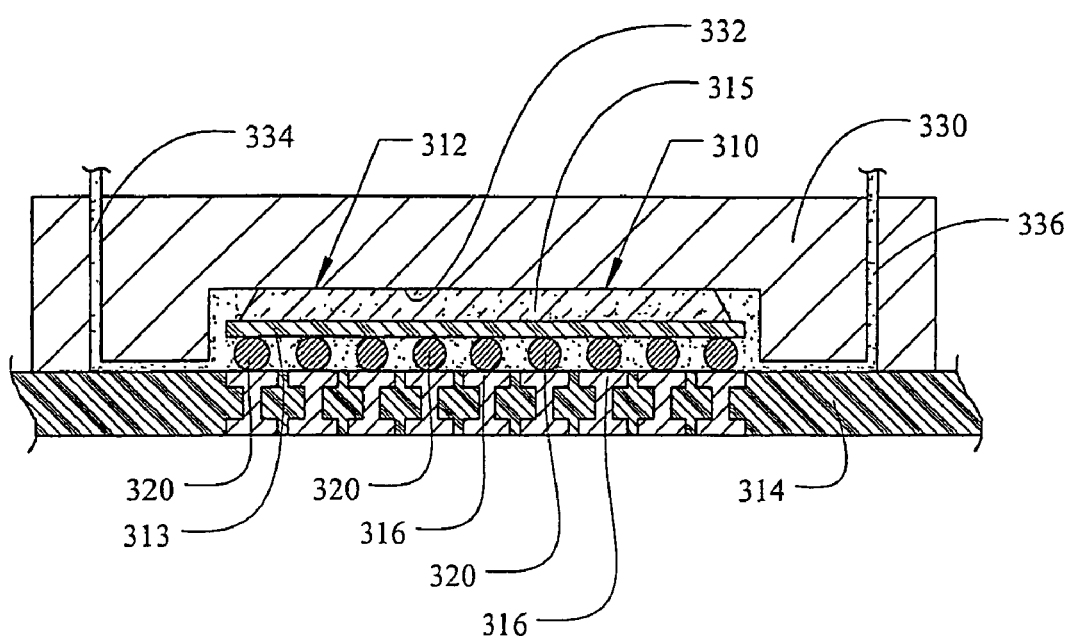
FIG. 7 is a sectional view of another electronic assembly being manufactured according to the method of the invention.

FIG. 7 is a sectional view of another electronic assembly 310 in the process of being manufactured according to the method of the invention. In this instance, electronic assembly 310 comprises an electronic component 312, such as a packaged integrated circuit (packaged IC), and a circuit board 314 that is manufactured according to the method of the invention. In the method of the invention, the packaged IC 312 includes a board component 313 that is attached to circuit board 314 by protruding solder bumps 320 of the packaged IC 312 which have already been soldered to contact pads on the bottom of the board component in accordance with standard practice as described above. Packaged IC 312 is then placed on the surface of circuit board 314 so that solder bumps 320 engage contact pads 316 on the upper surface of circuit board 314 so that solder bumps 320 are in electrical contact with traces of the circuit board 314 forming various electrical circuits. Solder bumps 320 are then reflowed to attach packaged IC 312 to circuit board 314 electrically and mechanically in a conventional manner.

Packaged IC 312 is then underfilled. In order to underfill IC 312, a precision mold die 330 having a mold cavity 332, a gate 334 leading into the mold cavity and a vent 336 leading out of the mold cavity, is provided. Mold die 330 is then placed over packaged IC 312 and onto the upper surface of circuit board 314 so that the packaged IC 312 is inside mold cavity 332. The mold cavity 332 is sealed, preferably by holding or clamping mold die 330 against the upper surface of circuit board 314. The mold die 330 is preferably precisely dimensioned so that the inner upper surface of mold cavity 332 seals against the top surface of packaged IC 312.

Encapsulating material, such as thermoset pellets, preferably of an epoxy material are inserted into a transfer press and transferred or injected into mold cavity 332 through gate 334 to fill space between the respective confronting surfaces of the board component 313 and the circuit board 314 encapsulating the solder bumps 320 that have been reflowed as shown in FIG. 7. The liquid epoxy material is elevated in temperature and forced under pressure to flow through gate 334 and into the space between the bottom surface of board component 313 and the top surface of circuit board 314. The liquid epoxy material is preferably also forced around the edge of board component 313 and around the sides of the housing shell 315 attached to the top of board component 313.

The flow of encapsulating material at an elevated temperature, removes all voids due to the packing pressure for a given period of time, for instance a packing pressure of 160 psi for 120 seconds with encapsulating material at a temperature of approximately 165 degrees centigrade. The epoxy material preferably has a CTE (coefficient of thermal expansion) matched to the surrounding packaged IC 312 and circuit board 314.

Following the cure of encapsulating material, the mold die 330 and the gate and vent runners are removed to expose the finished electronic assembly 310. Gate 334 and vent 336 are preferably designed to produce break points at the inner ends of the runners so that the runners are removed easily. Electronic assembly 310 can now proceed to final assembly packaging with less concern than typical precautions needed when transporting the electronic assembly 310 prior to underfill.

FIG. 7 illustrates the finished electronic assembly 310 where the epoxy encapsulating material that is injected into mold cavity 332 and then cured preferably surrounds the entire packaged IC 312 except for the top of shell housing 315. The top of the shell housing 315 is preferably in sealing contact with the mold die 330 during the underfilling process. Thus epoxy material does not flow into any space between the top of shell housing 315 and mold 330. This feature improves yield of electronic assemblies which require an efficient heat transfer.

The epoxy material provides the same protection as the prior art underfill materials while avoiding the considerable cure time and dispense time required by the prior art method. Moreover, since most packaged ICs dissipate heat through the top of the housing shell, the method of the invention improves yield in comparison to prior art methods.

We claim:

1. A method of making an electronic assembly having a laminated circuit board with contact pads on a surface and a flip chip having protruding solder bump on a surface comprising the steps of:

placing the flip chip on the surface of the laminated circuit board so that the solder bumps of the flip chip engage the contact pads of the laminated circuit device, providing a heat sink shell having a window, placing the heat sink shell over the flip chip and onto the surface of the laminated circuit board, providing a mold die having a mold cavity, a gate leading into the mold cavity and a vent leading out of the mold cavity, placing the mold die over the heat sink shell and onto the surface of the laminated circuit device outwardly of the flip chip so that the flip chip and the heat sink are in the mold cavity and the mold cavity is sealed, and injecting an epoxy material through the gate into the mold cavity and through the window into space between the flip chip and the laminated circuit board, such that the epoxy material encapsulates the solder bumps and contacts.

2. The method of making the electronic assembly of claim 1 wherein the heat sink shell has a peripheral wall engaging the laminated circuit board and wherein the window is disposed in the peripheral wall of the heat sink shell for epoxy to pass through and into the space between the respective surfaces of the flip chip and the laminated circuit board.

3. The method of making the electronic assembly of claim 1 wherein the mold die is removed and the electronic assembly is trimmed to remove any epoxy runners from the gate and the vent.

* * * * *